US005598323A

United States Patent [19]

Muller

[11] Patent Number: 5,598,323

[45] Date of Patent: Jan. 28, 1997

[54] DEVICE FOR PROTECTING A COMPUTER

[75] Inventor: Joseph J. P. M. Muller, 's-Hertogenbosch, Netherlands

[73] Assignee: Tulip Computers International B.V., Netherlands

[21] Appl. No.: 396,497

[22] Filed: Mar. 2, 1995

[30] Foreign Application Priority Data

Mar. 3, 1994 [NL] Netherlands .......................... 9400327

[51] Int. Cl.$^6$ ..................................................... H05K 5/00

[52] U.S. Cl. .................... 361/726; 361/724; 70/DIG. 30; 200/43.01

[58] Field of Search ................................... 361/724, 725, 361/726, 759; 200/43.22, 43.14, 43.16, 43.11, 43.01, 43.19; 220/210; 70/DIG. 30, 58

[56] References Cited

U.S. PATENT DOCUMENTS

| | | | |
|---|---|---|---|
| 4,623,765 | 11/1986 | Leyden | 200/43.22 |
| 4,638,129 | 1/1987 | Partus et al. | 200/43.22 |
| 5,077,991 | 1/1992 | Stickel et al. | 70/58 |
| 5,260,528 | 11/1993 | Benda | 200/43.14 |
| 5,434,378 | 7/1995 | McLean | 200/43.22 |
| 5,450,271 | 9/1995 | Fukushima et al. | 361/686 |
| 5,463,196 | 10/1995 | Darimont | 200/43.16 |

FOREIGN PATENT DOCUMENTS

| | | |
|---|---|---|
| 0480880 | 4/1992 | European Pat. Off. . |
| 8806050 | 6/1988 | Germany . |
| 4205338 | 7/1992 | Japan . |

*Primary Examiner*—Leo P. Picard
*Assistant Examiner*—Lynn D. Feild
*Attorney, Agent, or Firm*—Michaelson & Wallace; Peter L. Michaelson; John C. Pokotylo

[57] ABSTRACT

For the purpose of protecting a computer, the cover or the door (2) thereof, by which the computer housing can be closed, comprises a lock (8) operable by a key (9) and having a latch element (11) which in a first position prevents both the operation of the on/off switch (3) of the computer and the opening of the cover or the door, in a second position does not prevent the operation of the on/off switch but does prevent the opening of the cover or the door, and in a third position enables both the operation of the switch and the opening of the housing.

5 Claims, 2 Drawing Sheets

DEVICE FOR PROTECTING A COMPUTER

BACKGROUND OF THE INVENTION a. Field of the Invention

This invention relates to a computer comprising a housing, a door or cover for closing the housing, this door or cover in closed condition being located opposite a wall of the housing, and a switch for switching the computer on and off.

b. Related Art

Such computers are currently employed in businesses on a very large scale, the computer being usable both in a stand-alone situation as a personal computer and in the form of a "server" or terminal in a network. It is known that in each of the above applications, computers are frequently operated by unauthorized persons to illegally get possession of data stored in that computer or to be able to manipulate the data, or to introduce a computer virus into the computer or into the network. Further certain setups to be executed in the interior of the computer are changed and even that certain parts, such as plug-in circuit boards, disk drives, etc., are stolen from computers.

It is known to prevent unauthorized access to computer-stored data by the use of access codes (passwords), but in many cases such protection is not optimal because the password is easy to trace or guess, for instance by a malicious third party. Also, a password does not provide protection against physical intervention in the interior of the computer.

The object of the invention is to provide a device for protecting a computer, which device can be used in addition to any existing electronic protections and which provides additional protection against unauthorized use of the computer and also provides protection against unauthorized opening of the computer housing.

SUMMARY OF THE INVENTION

To that end, the invention provides a computer of the above-mentioned type, to the cover or door of which is fixed the case of a lock operable with a key, as well as an operating member for the switch. The lock case includes a latch element positionable in three positions by means of the key. In a first position, the latch element blocks the operating member of the switch and also prevents the housing from being opened. In a second position, the latch element prevents the housing from being opened. Finally in a third position, the latch element is located opposite an opening formed in the wall of the housing, which opening is shaped so as to permit the passage of the latch element. The or door can be opened and that the key can be removed from the lock case at least in the first and the second position of the latch element.

JP-A-04 205 338 discloses a protective mechanism with a lock for a computer, having a two-fold function: a lip-shaped latch element connected to a lock blocks in one position of the lock the ejection key of a floppy disk drive, so that a floppy disk present in the drive cannot be removed, and further a switch 7, which is also operated by the key via the lock, gives a blocking signal for the keyboard. This known protective mechanism, however, does not provide protection against the computer being switched on and off by unauthorized persons, nor against physical access to the interior of the computer. Furthermore, the protective mechanism according to the present invention is purely mechanical and hence simpler and cheaper and has three positions instead of two.

Further, DE-U-8806050 discloses a lock which is provided with a lip-shaped latch element. The lock has two positions and in one of them the latch element blocks the operating member of a switch. This publication does not relate to the protection of computers and certainly not to the prevention of physical access to the interior thereof.

With the features according to the invention, the object contemplated is achieved in a simple and effective manner, as will appear from the description below of an exemplary embodiment with reference to the drawing. In the drawing:

DETAILED DESCRIPTION

Figure 1:
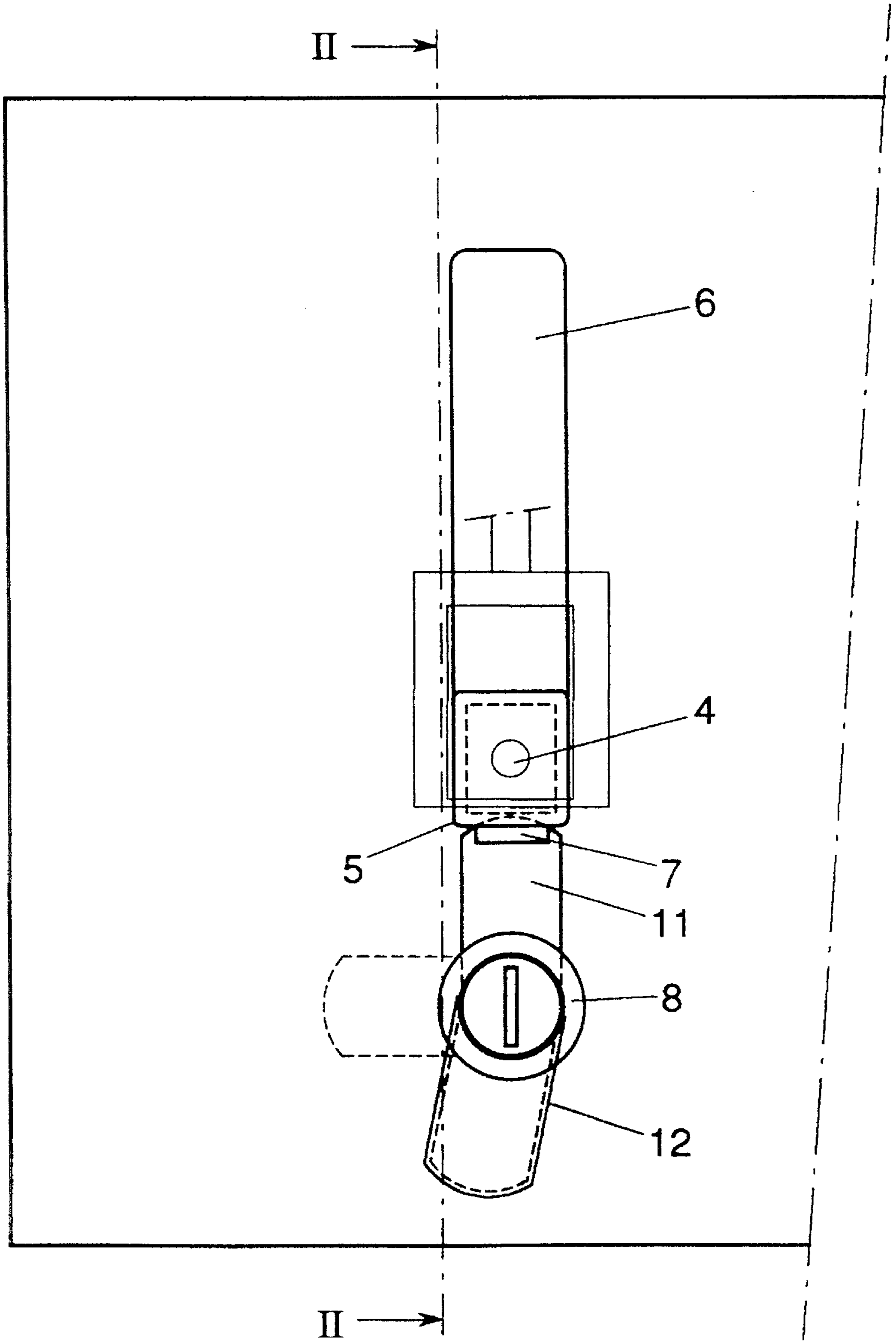
FIG. 1 shows a side elevation of the housing of a computer.

In the drawing, reference numeral 1 designates a wall of the housing of a computer. This housing may for instance consist of a square or rectangular bottom with four upright walls, one of which is wall 1. Placed over the open top of the housing is a cover which, at least on the side of the wall 1, has a wall 2. In many cases the cover consists of a plate of dimensions approximately equal to those of the bottom of the housing and a number of cover walls, for instance two or three, cover wall 2 being one of them.

Attached to wall 1 of the housing is a switch 3, mostly a mains switch, which has a push button 4 for switching the power supply for the computer on and off. Attached to the cover wall 2 is a plate-shaped element consisting of a push button operating member 5 and a resilient lip portion 6, for instance a leaf spring. At its end remote from the push button operating member 5, the portion 6 is connected to the wall 2. The push button operating member 5 freely projects outside through an opening in the cover wall 2 and owing to the resilient portion 6 can be depressed when the cover is placed on the housing to thereby operate the push button 4 of the switch 3. Formed on the push button operating member 5 is an extension 7 which projects into the proximity of, or into, the sidewall 1 which at that point is provided with an opening for allowing the extension 7 to pass. The purpose of this projection is further described hereinbelow.

Attached to the cover wall 2 by means of a nut 10 is a cylinder lock 8 which is operable with a key. Attached at the free end of the part of the lock 8 that can be moved by the key 9 is a lip-shaped bit 11 functioning as latch, element. The lip-shaped bit 11 extends substantially parallel to the cover wall 2. The distance d between the cover wall 2 and the wall 1 is so dimensioned that the bit 11, when the cover is secured to the housing, extends behind the wall 1 of the housing, substantially parallel to that wall. To allow, the wall 1 is provided with an opening 12 whose dimensions are at least such that the bit 11 can be brought inside the housing 1 when the bit 11, in accordance with a position of the key 9, is disposed in a position which is downwardly directed in the exemplary embodiment. In a second position of the key 9 the bit 11 is rotated through approximately 90° and extends behind a closed portion of the wall 1, so that the cover cannot be removed from the housing. In yet another position of the key 9, in which the bit 11 is rotated through approximately 90° again, the bit not only extends behind the closed portion of the wall 1, but also into the path travelled by the extension 7 of the push button operating member 5 when this push button operating member is being depressed to operate the switch 3. In this manner, in the last-mentioned position of the key 9, it is neither possible to remove the cover from the housing nor to operate the mains switch 3, which, on the one hand, prevents a computer in the off-condition from being operated or opened by unauthorized persons and, on the other hand, prevents a computer in the on-condition, for instance a network server, from being switched off by unauthorized persons. Especially in the last-mentioned case, when a computer serves as a network server, unauthorized switch-off can give rise to all kinds of undesirable situations for the users of the network. In the second position of the key 9 the computer can be switched on normally by means of the switch 3 but physical access by unauthorized persons to the interior of the computer remains impossible, provided, of course, that the key 9 has been removed from the lock. This position is of importance when the computer or terminal is to permit normal use while yet preventing changes being made in the interior thereof or even theft of parts thereof.

Figure 3:
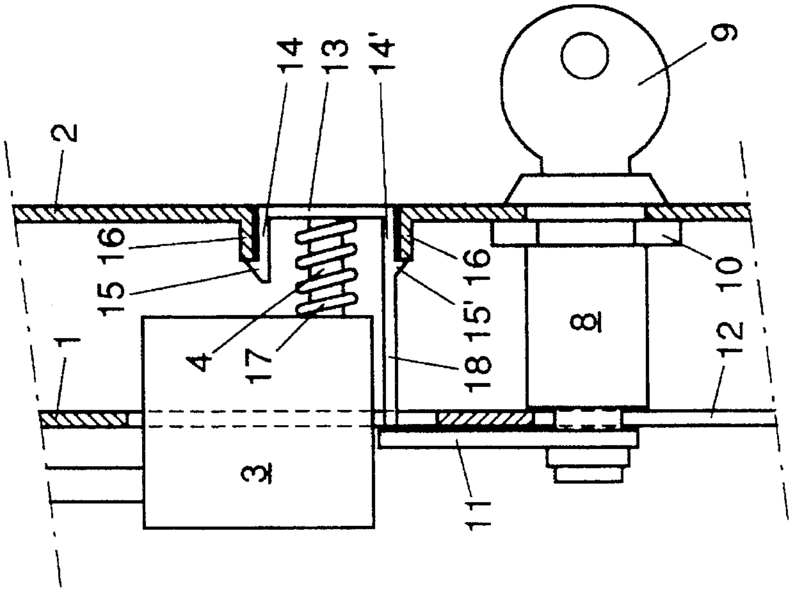
FIG. 3 shows a side elevation similar to FIG. 2 of an alternative embodiment of an operating member for the switch.
Figure 2:
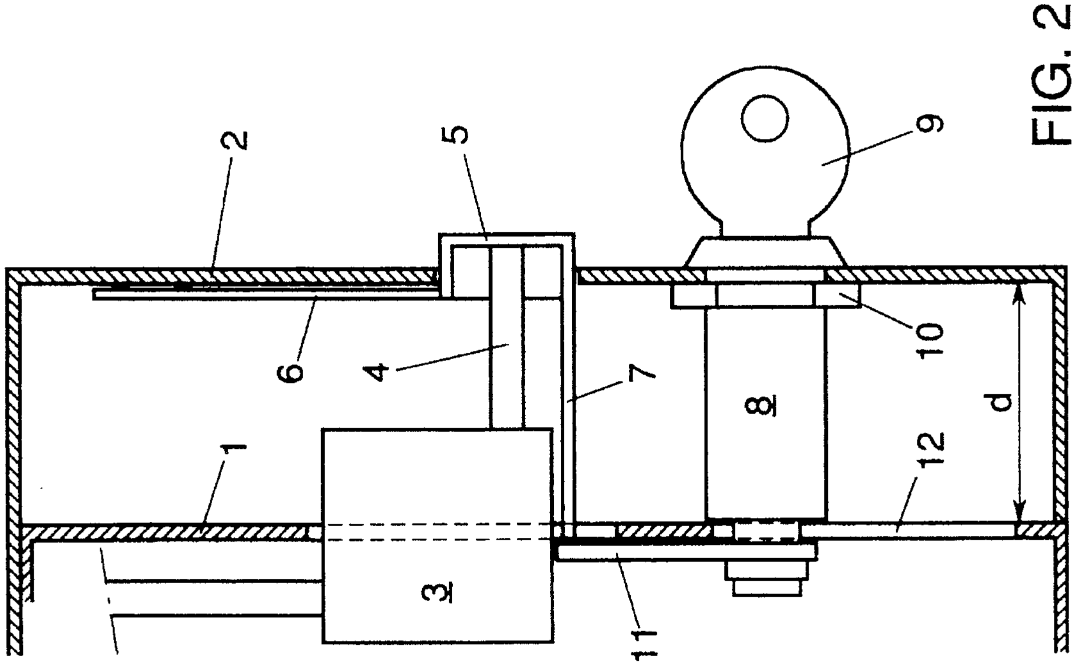
FIG. 2 shows a partial section of the side of the housing of a computer along the line II—II in FIG. 1.

FIG. 3 shows a variant for the operation and blocking of the switch 3. In this figure, parts corresponding with those in FIGS. 1 and 2 are designated by the same reference numerals. This exemplary embodiment lacks the resilient lip portion 6 but comprises a push button operating member 13 having two wall portions 14, 14' projecting inwardly relative to the cover wall 2. The free end of the wall portion 14 is provided with a hooked projection 15 which can cooperate with an inwardly bent portion 16 of the cover wall 2, while the wall portion 14' is provided with a hooked portion 15' which can cooperate with an inwardly bent portion 16' of the cover wall 2. The purpose of the two hook portions is to prevent the push button operating member 13 from falling out of the cover wall 2. Arranged around the push button 4 of the switch 3 is a helical spring 17 which urges the push button operating member 13 of the switch 3 in the position wherein the hooked portions 15, 15' abut against the wall portions 16, 16' . Formed on the wall portion 14' is an extension 18 which has the same function as the extension 7 in FIG. 2 and which can be blocked by the lock bit 11 upon depression of push button operating member 13.

In the foregoing, the protection for a computer has been described for the case where the computer comprises an open top and a cover to be placed over it. It will be clear, however, that the protection described is also useful for different forms of housings, for instance in the case of a "tower" housing which is closed with a door at the front. The lock is then fixedly attached to the door, while also the push button operating member 5 or 13 for operating the mains switch is fitted in the door. The switch 3 is then mounted on the frame of the computer and in that frame an opening is formed for allowing the passage of the lip-shaped bit 11 of the lock in one position of the key and for allowing the passage of the extension 7 or 18 of the push button operating member 5 or 13 for blocking the operation of the mains switch in another position of the key 9. It will be clear that it is important that the key 9 can be removed from the lock both in the position where the cover or the door is latched to the housing and in the position where in addition the switch is latched as well.

I claim:

1. A computer comprising:

a housing having a wall, the wall defining an opening;

a cover for closing the housing, said cover having a closed condition in which it is located opposite the wall of the housing;

a switch for switching the computer on and off;

a lock having a lock case fixed to the cover;

a key for operating the lock;

an operating member for actuating the switch and being fixed to the cover;

a latch element coupled with the lock and being positionable into three positions with the key, wherein, in a first of the three positions, the latch element blocks the operating member from actuating the switch and prevents the cover for closing the housing from being opened, in a second of the three positions, the latch element prevents the cover for closing the housing from being opened, and in a third of the three positions, the latch element is located opposite the opening defined in the wall of the housing, the opening being shaped so as to permit passage of the latch element therethrough, wherein the cover can be opened and the key can be removed from the lock case at least in the first and the second of the three positions of the latch element.

2. A computer according to claim 1 wherein the latch element is a lip-shaped lock bit which extends in a plane parallel to the wall of the housing.

3. A computer according to claim 1 wherein the operating member is bearing-mounted or affixed to the cover so as to be resiliently moveable relative to the cover and further comprises an extended portion which, upon depression of the operating member, moves along a path which is blocked by the latch element of the lock in the first of the three positions.

4. The computer of claim 1 wherein the latch element extends in a plane parallel to the wall of the housing regardless of the condition of the cover.

5. The computer of claim 1 wherein, in the first of the three positions, in which the latch element blocks the operating member from actuating the switch, the switch may be in an on state.

* * * * *